US011402422B2

(12) United States Patent
Goodjohn et al.

(10) Patent No.: US 11,402,422 B2
(45) Date of Patent: Aug. 2, 2022

(54) METHODS FOR DETECTING SENSOR FAULTS IN A CONSUMER APPLIANCE

(71) Applicant: Haier US Appliance Solutions, Inc., Wilmington, DE (US)

(72) Inventors: Paul Goodjohn, Crestwood, KY (US); Andrew L. Reder, Louisville, KY (US)

(73) Assignee: Haier US Appliance Solutions, Inc., Wilmington, DE (US)

( * ) Notice: Subject to any disclaimer, the term of this patent is extended or adjusted under 35 U.S.C. 154(b) by 183 days.

(21) Appl. No.: 16/848,955

(22) Filed: Apr. 15, 2020

(65) Prior Publication Data

US 2021/0325440 A1 Oct. 21, 2021

(51) Int. Cl.

| *G01R 31/08* | (2020.01) |
|---|---|
| *G01K 7/02* | (2021.01) |
| *G01R 31/28* | (2006.01) |
| *G01K 7/22* | (2006.01) |
| *F24H 1/18* | (2022.01) |

(52) U.S. Cl.
CPC ............ *G01R 31/08* (2013.01); *G01K 7/02* (2013.01); *G01K 7/22* (2013.01); *G01R 31/2829* (2013.01); *F24H 1/18* (2013.01)

(58) Field of Classification Search
CPC ...... G01R 31/08; G01R 31/2829; G01K 7/02; G01K 7/22; F24H 1/18; F24H 4/04; F24H 9/2021; F24H 1/201
See application file for complete search history.

(56) References Cited

U.S. PATENT DOCUMENTS

| 6,246,831 B1 * | 6/2001 | Seitz | F24H 9/2021 219/483 |
|---|---|---|---|
| 7,046,180 B2 | 5/2006 | Jongsma et al. | |
| 9,509,332 B1 | 11/2016 | Garrity et al. | |
| 11,205,554 B1 * | 12/2021 | Riley | H01J 1/135 |
| 2014/0219316 A1 * | 8/2014 | Tashiro | G01K 7/22 374/185 |
| 2016/0132091 A1 * | 5/2016 | Bodner | G06F 1/06 713/323 |
| 2019/0063978 A1 * | 2/2019 | Brodbeck | E03F 9/007 |

* cited by examiner

*Primary Examiner* — Akm Zakaria
(74) *Attorney, Agent, or Firm* — Dority & Manning, P.A.

(57) ABSTRACT

A method for operating a consumer appliance, as provided herein, may include detecting a preliminary first conversion value from a first sensor input pin electrically connected to an analog-to-digital converter (ADC) and detecting a preliminary second conversion value from a second sensor input pin electrically connected to the ADC in electrical parallel with the first sensor input pin. The method may further include determining a preliminary variation between the preliminary first and second conversion values is less than or equal to a predetermined preliminary threshold. The method may still further include activating a pull-up resistor in electrical communication with the first sensor input pin, identifying a fault state in response based on a conversion value variation following activating the pull-up resistor, and directing the appliance based on the determined fault state.

19 Claims, 3 Drawing Sheets

METHODS FOR DETECTING SENSOR FAULTS IN A CONSUMER APPLIANCE

FIELD OF THE INVENTION

The present subject matter relates generally to methods for operating consumer appliances, such as water heater appliances, and more particularly to methods for detecting when sensor connection failure or fault condition occurs.

BACKGROUND OF THE INVENTION

Consumer (e.g., household or domestic) appliances are used generally for a variety of tasks by a variety of users. For example, a household may include such appliances as a water heater appliance, laundry appliances (e.g., a washing machine or dryer appliance), kitchen appliances (e.g., a refrigerator, a microwave, a coffee maker, etc.), along with room air conditioners and various other appliances.

It is common for modern consumer appliances to include multiple sensors configured to detect one or more physical characteristics of the appliance (e.g., temperature during operation) and direct information regarding the one or more physical characteristics to a controller of the consumer appliance. Often, multiple identical sensors (e.g., sensors having the same configuration or model type) are provided within a single appliance. In other words, more than one identical sensors are often connected to the controller.

Although various sensors can be useful to detect one or more characteristics of the appliance (e.g., during use), it can be difficult to know if a controller is no longer able to receive signals from a sensor. This may be the case, for instance, if a pin connection to the controller (or a sensor connected through the pin connection) has short circuited. In particular, adjacent pins may be vulnerable to a pin-to-pin short circuit. When identical sensors are connected to adjacent pins, a short circuit may be especially difficult to detect.

As a result, it would be useful to provide a consumer appliance or operation method having one or more features for detecting or addressing a fault (e.g., at a connection pin or sensor) on a controller of the consumer appliance.

BRIEF DESCRIPTION OF THE INVENTION

Aspects and advantages of the invention will be set forth in part in the following description, or may be obvious from the description, or may be learned through practice of the invention.

In one exemplary aspect of the present disclosure, a method of operating an appliance is provided. The method may include detecting a preliminary first conversion value at a first sensor input pin electrically connected to an analog-to-digital converter (ADC) and detecting a preliminary second conversion value at a second sensor input pin electrically connected to the ADC in electrical parallel with the first sensor input pin. The method may further include determining a preliminary variation between the preliminary first and second conversion values is less than or equal to a predetermined preliminary threshold. The method may still further include activating a pull-up resistor in electrical communication with the first sensor input pin, detecting a secondary first conversion value at the first sensor input pin during activation of the pull-up resistor, and detecting a secondary second conversion value at the second sensor input during activation of the pull-up resistor. The method may yet further include determining a secondary variation between the secondary first and second conversion values is less than or equal to a predetermined secondary threshold; identifying a fault state in response to determining the secondary variation; and directing the appliance based on the determined fault state.

In another exemplary aspect of the present disclosure, a method of operating an appliance is provided. The method may include detecting a preliminary first conversion value from a first sensor input pin electrically connected to an analog-to-digital converter (ADC) and detecting a preliminary second conversion value from a second sensor input pin electrically connected to the ADC in electrical parallel with the first sensor input pin. The method may further include determining a preliminary variation between the preliminary first and second conversion values is less than or equal to a predetermined preliminary threshold. The method may still further include activating a pull-up resistor in electrical communication with the first sensor input pin, identifying a fault state in response based on a conversion value variation following activating the pull-up resistor, and directing the appliance based on the determined fault state.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures.

DETAILED DESCRIPTION

Figure 1:
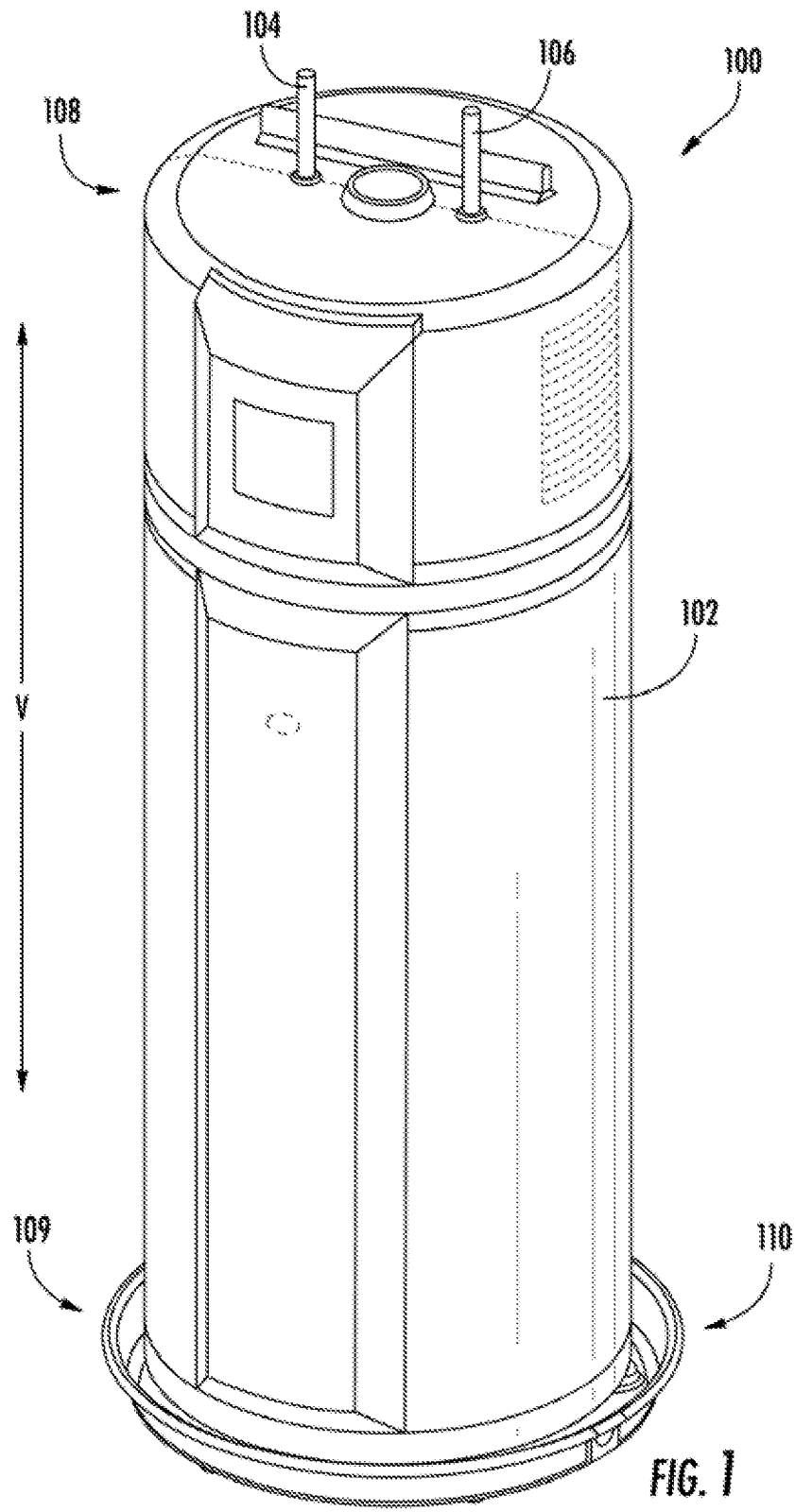
FIG. 1 provides a perspective view of a consumer appliance according to an exemplary embodiment of the present disclosure.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the term "or" is generally intended to be inclusive (i.e., "A or B" is intended to mean "A or B or both"). The terms "first," "second," and "third" may be used interchangeably to distinguish one component from another and are not intended to signify location or importance of the individual components.

Figure 2:
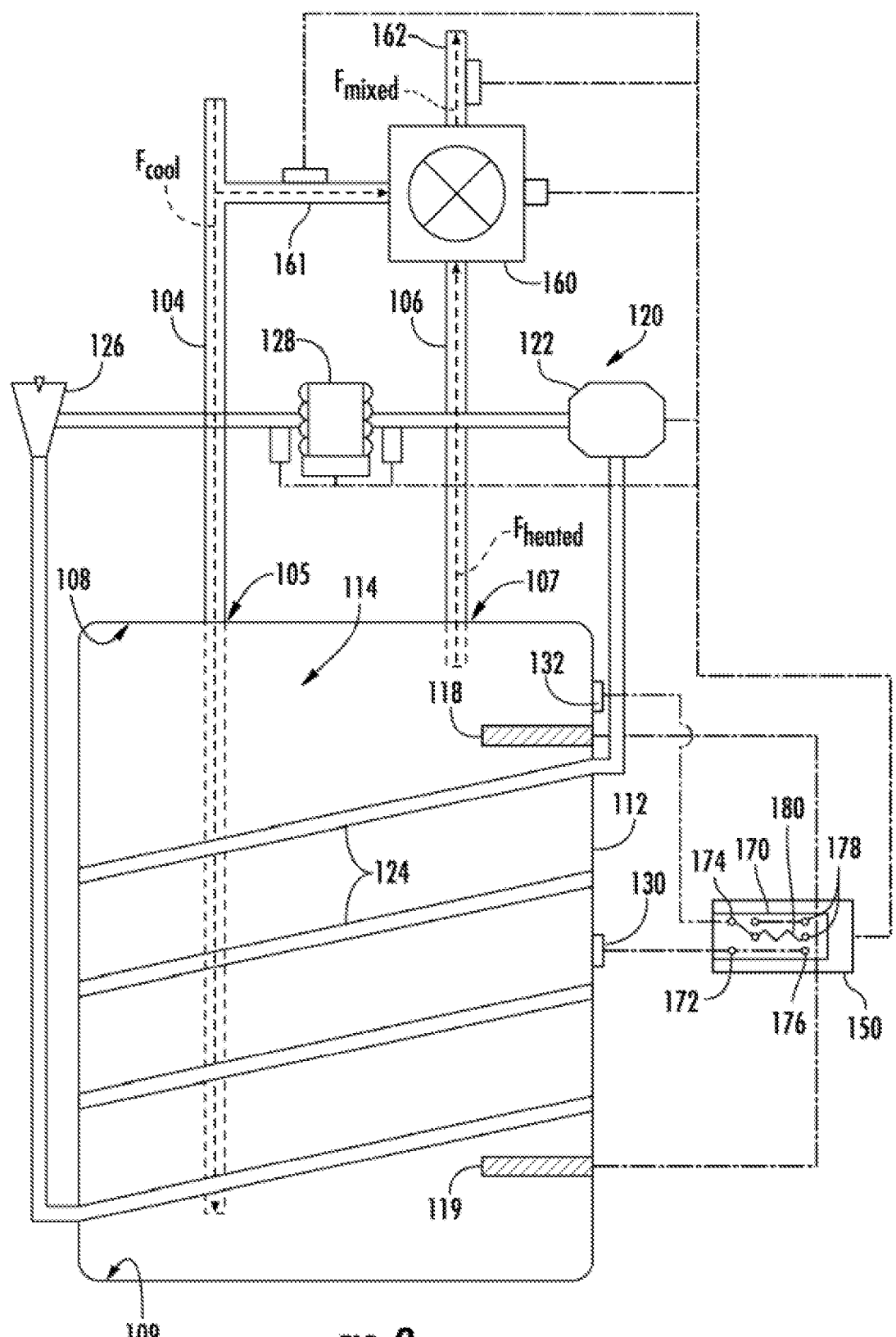
FIG. 2 provides a schematic view of certain components of the exemplary consumer appliance of FIG. 1.

Turning now to the figures, FIG. 1 provides a perspective view of a water heater appliance 100 according to an exemplary embodiment of the present disclosure. FIG. 2 provides a schematic view of certain components of water heater appliance 100. As may be seen in FIGS. 1 and 2, water heater appliance 100 includes a casing 102 and a tank (i.e., water tank) 112 mounted within casing 102. Tank 112 defines an interior volume 114 for heating water therein.

It is noted that although consumer appliance 100 is shown as a water heater appliance, additional or alternative embodiments may provide a different consumer appliance (e.g., different type of appliance), such as a refrigerator appliance, an oven appliance, microwave appliance, dishwasher appliance, washing machine appliance, dryer appliance, or any other suitable consumer appliance, except as otherwise indicated.

Water heater appliance 100 also includes an inlet conduit 104 and an outlet conduit 106 that are both in fluid communication with tank 112 within casing 102. As an example, cold water from a water source, such as a municipal water supply or a well, enters water heater appliance 100 through inlet conduit 104 (e.g., at an inlet 105 extending through an upper portion of tank 112). From inlet conduit 104, such cold water enters interior volume 114 of tank 112 wherein the water is heated to generate heated water. Such heated water exits water heater appliance 100 at outlet conduit 106 (e.g., supplied through an outlet 107 at an upper portion of tank 112) and, for example, is supplied to a bath, shower, sink, or any other suitable feature.

As shown, interior volume 114 of tank 112 extends between a top portion 108 and a bottom portion 109 along a vertical direction V. Thus, water heater appliance 100 is generally vertically oriented. Water heater appliance 100 can be leveled (e.g., such that casing 102 is plumb in the vertical direction V) in order to facilitate proper operation of water heater appliance 100.

In certain embodiments, a drain pan 110 is positioned at bottom portion 109 of water heater appliance 100 such that water heater appliance 100 sits on drain pan 110. Drain pan 110 sits beneath water heater appliance 100 along the vertical direction V (e.g., to collect water that leaks from water heater appliance 100 or water that condenses on an evaporator 128 of water heater appliance 100). It should be understood that water heater appliance 100 is provided by way of example only and that the present subject matter may be used with any suitable water heater appliance.

Figure 3:
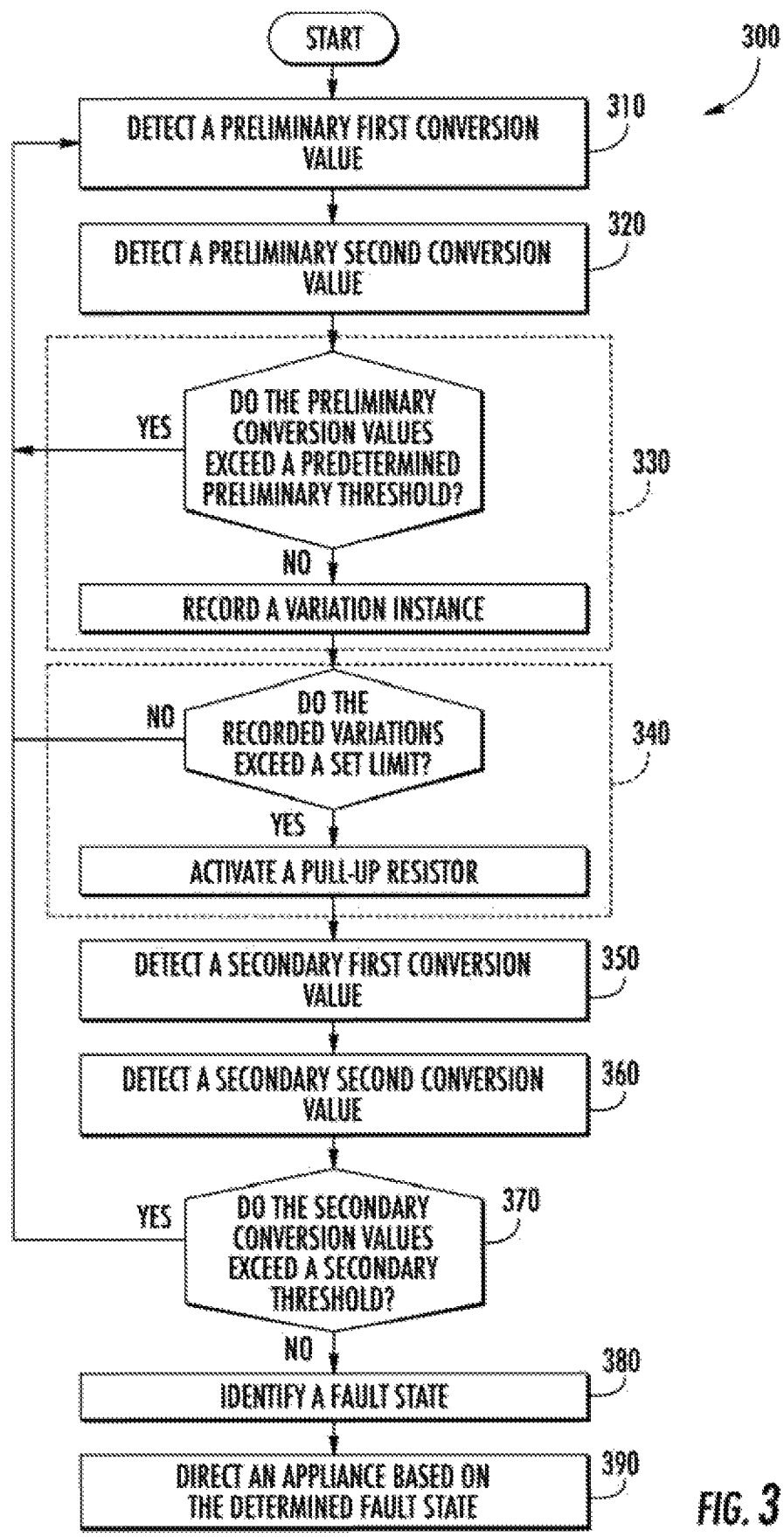
FIG. 3 provides a flow chart illustrating a method of operating a consumer appliance according to exemplary embodiments of the present disclosure.

Turning especially to FIGS. 2 and 3, water heater appliance 100 generally includes one or more electric heating elements, such as an upper heating element 118 or a lower heating element 119, for heating water within interior volume 114 of tank 112. Upper and lower heating elements 118 and 119 can be any suitable heating elements. For example, upper heating element 118 or lower heating element 119 may be an electric resistance element, an induction element, or any other suitable electric heating element or combination thereof. In optional embodiments, a sealed system 120 is further provided on or about tank 112 to heat water within interior volume 114.

In certain embodiments, sealed system 120 includes a compressor 122, a condenser 124, a throttling device 126, and an evaporator 128. Condenser 124 is thermally coupled or assembled in a heat exchange relationship with tank 112 in order to heat water within interior volume 114 of tank 112 during operation of sealed system 120. In particular, condenser 124 may be a conduit coiled around and mounted to tank 112. During operation of sealed system 120, refrigerant exits evaporator 128 as a fluid in the form of a superheated vapor or high quality liquid vapor mixture. Upon exiting evaporator 128, the refrigerant enters compressor 122 wherein the pressure and temperature of the refrigerant are increased such that the refrigerant becomes a superheated vapor. The superheated vapor from compressor 122 enters condenser 124 wherein it transfers energy to the water within tank 112 and condenses into a saturated liquid or high quality liquid vapor mixture. This high quality/saturated liquid vapor mixture exits condenser 124 and travels through throttling device 126 that is configured for regulating a flow rate of refrigerant therethrough. Upon exiting throttling device 126, the pressure and temperature of the refrigerant drop at which time the refrigerant enters evaporator 128 and the cycle repeats itself. In certain exemplary embodiments, throttling device 126 may be an electronic expansion valve (EEV).

As shown, water heater appliance 100 includes one or more tank temperature sensors, such as a first temperature sensor 130 (e.g., lower temperature sensor) and a second temperature sensor 132 (e.g., upper temperature sensor). Generally, tank temperature sensors 130, 132 are configured for measuring a temperature of water within interior volume 114 of tank 112 and can be any suitable temperature sensing device (e.g., in operative communication with a controller 150 at a corresponding connection pin 172, 174). For example, one or more tank temperature sensors 130, 132 may be provided as a thermocouple or thermistor. Thus, each temperature sensor 130 and 132 may be configured to transmit a voltage signal (e.g., corresponding to a detected temperature) to controller 150.

When assembled, one or more tank temperature sensors 130, 132 may be positioned within interior volume 114 of tank 112 or may be mounted to tank 112 outside of interior volume 114 of tank 112. When mounted to tank 112 outside of interior volume 114 of tank 112, a tank temperature sensor (e.g., first temperature sensor 130 or second temperature sensor 132) can be configured for indirectly measuring the temperature of water within interior volume 114 of tank 112. For example, tank temperature sensors 130, 132 can measure the temperature of tank 112 and correlate the temperature of tank 112 to the temperature of water within interior volume 114 of tank 112.

Water heater appliance 100 further includes a power source or controller 150 that is configured for regulating operation of water heater appliance 100 (e.g., by selectively directing electrical power energy from a connected power grid). Controller 150 is in, for example, operative communication (e.g., electrical communication through one or more conductive wires/busses) with upper heating element 118, lower heating element 119, compressor 122, or tank temperature sensors 130, 132. Thus, controller 150 may selectively activate upper and lower heating element 118 and 119 or compressor 122 in order to heat water within interior volume 114 of tank 112. As an example, controller 150 may activate/deactivate heating elements 118, 119 in response to signals from temperature sensors 130, 132.

In some embodiments, controller 150 includes memory (e.g., non-transitive media) and one or more processing devices such as microprocessors, CPUs or the like, such as general or special purpose microprocessors operable to execute programming instructions or micro-control code associated with operation of water heater appliance 100. The memory can represent random access memory such as DRAM, or read only memory such as ROM or FLASH. The processor executes programming instructions stored in the memory. The memory can be a separate component from the processor or can be included onboard within the processor. Alternatively, controller 150 may be constructed without using a microprocessor (e.g., using a combination of discrete analog or digital logic circuitry; such as switches, amplifiers, integrators, comparators, flip-flops, AND gates, and the like) to perform control functionality instead of relying upon software.

In additional or alternative embodiments, controller 150 includes an analog-to-digital converter (ADC) 170. Generally, ADC 170 may include any suitable circuit or architecture to convert an analog (e.g., voltage) signal into a digital signal (e.g., digital conversion value), as would be understood. One or more analog connection pins (e.g., first input pin 172 and second input pin 174) may be provided on ADC 170 such that one or more components can electrically connect to controller 150 at ADC 170 (e.g., for the transmission of analog signals thereto). Moreover, one or more digital connection pins (e.g., a first output pin 176 and a second output pin 178) may be provided on ADC 170 such that ADC 170 can further connect to other portions of controller 150 (e.g., for the transmission of digital signals thereto). As shown, each digital connection pin 176, 178 may correspond to a discrete analog connection pin 172, 174.

In optional embodiments, an effective pull-up resistor 180 is provided in selective electrical communication with at least one of the analog connection pins 172, 174. For instance, one or more of the analog connection pins 172, 174 may be selectively connected (e.g., via a suitable switch) to two discrete electrical paths, one of which includes the effective pull-up resistor 180 and, thus, has an effective resistance that is higher than the other, resistance electrical path. In other words, one path is a high-resistance electrical path and the other is a low-resistance path. Both electrical paths may terminate at a digital connection pin (e.g., the same digital connection pin or a separate digital connection pin) and, thus, may permit the analog signal received at the corresponding analog connection pin (e.g., second input pin 174) to be read as a digital signal (e.g., as a conversion value) from either the low-resistance path or the high-resistance path. As an example, second input pin 174 may be selectively switched between the low-resistance path (e.g., for typical temperature-dependent sequences) and the high-resistance path with pull-up resistor 180 (e.g., for fault-detecting sequences). In other words, pull-up resistor 180 may be selectively activated by switching to the high-resistance path, such as to detect a fault in one or more of the sensors connected to ADC 170. If and when pull-up resistor 180 is inactive (e.g., second input pin 174 is switched to the low-resistance path), an unmodified (e.g., preliminary or primary) conversion value may be detected at controller 150 based on an analog signal received at second input pin 174. By contrast, if and when pull-up resistor 180 is activated (e.g., second input pin 174 is switched to connect to the high-resistance path), a modified (e.g., secondary) conversion value may be detected at controller 150 based on an analog signal (e.g., new analog signal) received at second input pin 174.

In certain embodiments, the resistance at the low-resistance path of one analog connection pin (e.g., second input pin 174) may be substantially identical to the resistance of a path from another analog connection pin (e.g., first input pin 172) to its corresponding digital connection pin (e.g., first output pin 176). In some such embodiments, the connection path between first input pin 172 and first output pin 176 is a low-resistance path that is substantially identical and parallel to a selective low-resistance path between second input pin 174 and second output pin 178.

When assembled, first temperature sensor 130 may be connected (e.g., through a first wired path) to controller 150 at a corresponding first input pin 172. Similarly, second temperature sensor 132 may be connected (e.g., through a second wired path) at a corresponding second output pin 178. Optionally, second input pin 174 may be adjacent to first input pin 172. Moreover, when assembled, second temperature sensor 132 may be connected to controller 150 in parallel to first temperature sensor 130.

Controller 150 may operate upper heating element 118, lower heating element 119, or compressor 122 in order to heat water within interior volume 114 of tank 112. As an example, a user may select or establish a predetermined set temperature, $t_s$, for water within interior volume 114 of tank 112, or the set temperature $t_s$ for water within interior volume 114 of tank 112 may be a default value (e.g., selected during design or assembly of water heater appliance 100). Based upon the set temperature $t_s$ for water within interior volume 114 of tank 112, controller 150 may selectively activate upper heating element 118, lower heating element 119, or compressor 122 in order to heat water within interior volume 114 of tank 112 to the set temperature $t_s$ for water within interior volume 114 of tank 112. In particular, activation of the heating elements 118, 119 may be based on one or more digital signals generated by ADC 170 from analog signals transmitted from first temperature sensor 130 or second temperature sensor 132.

In optional embodiments water heater appliance 100 also includes a mixing valve 160 and a mixed water outlet conduit 162. Mixing valve 160 may be in fluid communication with inlet conduit 104 via a bypass conduit 161, tank 112, and mixed water outlet conduit 162. As would be understood, mixing valve 160 may be configured for selectively directing water from inlet conduit 104 and tank 112 into mixed water outlet conduit 162 in order to regulate a temperature of water within mixed water outlet conduit 162. Mixing valve 160 may be positioned or disposed within casing 102 of water heater appliance 100 (e.g., such that mixing valve 160 is integrated within water heater appliance 100).

Advantageously, the present methods may detect or respond to instances in which multiple sensors or connection pins fail (e.g., short out), even when such failures occur or are present at the same time.

Turning now to FIG. 3, a flow chart is provided of a method 300 according to an exemplary embodiment of the present disclosure. Generally, the method 300 provides for controlling and operating a consumer appliance (e.g., water heater appliance 100-FIG. 2), such as according to an appliance operation. In particular, method 300 may provide for directing operations based on one or more sensor readings (e.g., at first temperature sensor 130 and second temperature sensor 132). For instance, method 300 direct operation of appliance 100 upper heating element 118, lower heating element 119, compressor 122, or mixing valve 160 (FIG. 2). The method 300 may be performed, for instance, by the controller 150. As described above, the controller 150 may be in operative communication with temperature sensors 130 and 132, upper heating element 118, lower heating element 119, compressor 122, or mixing valve 160. Controller 150 may send signals to and receive signals from one or more of temperature sensors 130 and 132, upper heating element 118, lower heating element 119, compressor 122, or mixing valve 160. Controller 150 may further be in communication with other suitable components of the appliance 100 to facilitate operation of the corresponding appliance 100, generally.

Referring to FIG. 3, at 310, the method 300 includes detecting a preliminary first conversion value from a first sensor input pin (i.e., first input pin). As described above, the first sensor input pin is electrically connected to an ADC. Generally, the preliminary first conversion value may be detected by receiving an analog (e.g., voltage) signal at the first sensor input pin. From the analog signal, the ADC may generate a corresponding digital conversion value, as would be understood. During typical (i.e., non-fault) use, the analog signal at the first sensor input pin may generally correspond to a characteristic (e.g., temperature) at the first sensor. By contrast, during a fault state, the analog signal may correspond to aberrant or inaccurate temperature readings (e.g., received at the first sensor input pin).

At 320, the method 300 includes detecting a preliminary second a preliminary second conversion value from a second sensor input pin (i.e., second input pin). As described above, the second sensor input pin is electrically connected to the ADC (e.g., in electrical parallel to the first sensor input pin). Generally, the preliminary second conversion value may be detected by receiving an analog (e.g., voltage) signal at the second sensor input pin. The analog signal may be directed through a low-resistance path, as described above. From the analog signal, the ADC may generate a corresponding digital conversion value, as would be understood. Optionally, 320 may occur simultaneously to 310. During typical (i.e., non-fault) use, the analog signal at the second sensor input pin may generally correspond to a characteristic (e.g., temperature) at the second sensor. By contrast, during a fault state, the analog signal may correspond to aberrant or inaccurate temperature readings (e.g., received at the second sensor input pin).

At 330, the method 300 includes determining a preliminary variation between the preliminary first and second conversion values is less than or equal to a predetermined preliminary threshold. For instance, the preliminary first conversion value of 310 may be compared to the preliminary second conversion value of 320, such as by dividing one value by the other to generate a preliminary comparative percentage. The comparative percentage may be then compared to the predetermined preliminary threshold, such as to determine if one is greater than the other. If the preliminary conversion values (e.g., as represented by the preliminary comparative percentage) are greater than the predetermined preliminary threshold, the method 300 may return to 310. By contrast, if the preliminary conversion values (e.g., as represented by the preliminary comparative percentage) are less than or equal to the predetermined preliminary threshold, the method 300 may record the instance of variation (e.g., as unit or "debounce" count) and add the instance of variation to any previously-recorded instances. Thus, the number of times (e.g., successive times) in which the preliminary conversion values do not exceed the predetermined preliminary threshold may be counted or measured.

In some embodiments, the predetermined preliminary threshold is less than 1%. Thus, an instance in which the preliminary first conversion value differs from the preliminary second conversion value by a percentage that is less than 1% may be determined or recorded. In additional or alternative embodiments, the predetermined preliminary threshold is less than 0.5%. Thus, an instance in which the preliminary first conversion value differs from the preliminary second conversion value by a percentage that is less than 0.5% may be determined or recorded. In further additional or alternative embodiments, the predetermined preliminary threshold is less than 0.25%. Thus, an instance in which the preliminary first conversion value differs from the preliminary second conversion value by a percentage that is less than 0.25% may be determined or recorded.

At 340, the method 300 includes initiating a secondary evaluation. Generally, initiation of the secondary evaluation requires activating a pull-up resistor in (e.g., selective) electrical communication with the second sensor input pin, as described above. In certain embodiments, 340 requires determining that the number of recorded variations (e.g., debounce count) meets a predetermined number of determinations. Thus, the method 300 may require repeating 310 through 330 until the predetermined number of determinations is reached. In turn, 340 may be in response to the predetermined number of determinations being reached. Optionally, the predetermined number may be greater than or equal to 100. Additionally or alternatively, the determination of variations may be required to be consecutive. In other words, 340 may require determining that each of the preliminary variations that are recorded are successive (e.g., in time) and may not be interrupted by a determination that a preliminary variation between a preliminary first and second conversion values is greater than the predetermined preliminary threshold.

After or in response to the pull-up resistor being activated at 340, the method 300 may proceed to 350.

At 350, the method 300 includes detecting a secondary first conversion value from the first sensor input pin during activation of the pull-up resistor. Generally, the secondary first conversion value may be detected by receiving an analog (e.g., voltage) signal at the first sensor input pin while the pull-up resistor is activated or is otherwise in electrical series between the second input pin and the second output pin. From the analog signal, the ADC may generate a corresponding digital conversion value, as would be understood. During typical (i.e., non-fault) use, the analog signal at the first sensor input pin may generally correspond to a characteristic (e.g., temperature) at the first sensor. By contrast, during a fault state, the analog signal may correspond aberrant or inaccurate temperature readings (e.g., received at the first sensor input pin).

At 360, the method 300 includes detecting a secondary second conversion value from the second sensor input during activation of the pull-up resistor. Generally, the preliminary second conversion value may be detected by receiving an analog (e.g., voltage) signal at the second sensor input pin while the pull-up resistor is activated or is otherwise in electrical series between the second input pin and the second output pin. The analog signal may be directed through a high-resistance path, as described above. From the analog signal, the ADC may generate a corresponding digital conversion value, as would be understood. Optionally, 360 may occur simultaneously to 350. During typical (i.e., non-fault) use, the analog signal at the second sensor input pin may generally correspond to a characteristic (e.g., temperature) at the second sensor. By contrast, during a fault state, the analog signal may correspond to aberrant or inaccurate temperature readings (e.g., received at the second sensor input pin and directed across the pull-up resistor).

At 370, the method 300 includes determining a secondary variation between the secondary first and second conversion values is less than or equal to a predetermined secondary threshold. For instance, the secondary first conversion value of 350 may be compared to the secondary second conversion value of 360, such as by dividing one value by the other to generate a secondary comparative percentage. The comparative percentage may be then compared to the predetermined secondary threshold, such as to determine if one is greater than the other. If the secondary conversion values (e.g., as represented by the secondary comparative percentage) are greater than the predetermined secondary threshold, the method 300 may return to 310 (e.g., for continued or uninterrupted operation). By contrast, if the secondary conversion values (e.g., as represented by the secondary comparative percentage) are less than or equal to the predetermined secondary threshold, the method 300 may proceed to 380.

In some embodiments, the predetermined secondary threshold is less than 1%. Thus, an instance in which the secondary first conversion value differs from the secondary second conversion value by a percentage that is less than 1% may prompt the method 300 to proceed to 380. In additional or alternative embodiments, the predetermined secondary threshold is less than 0.5%. Thus, an instance in which the secondary first conversion value differs from the secondary second conversion value by a percentage that is less than 0.5% may prompt the method 300 to proceed to 380. In further additional or alternative embodiments, the predetermined secondary threshold is less than 0.25%. Thus, an instance in which the secondary first conversion value differs from the secondary second conversion value by a percentage that is less than 0.25% may prompt the method 300 to proceed to 380.

Optionally, the predetermined secondary threshold is equal to the predetermined preliminary threshold.

At 380, the method 300 includes identifying a fault state of the appliance. Specifically, the fault state may be determined in response to 370. In some such embodiments, the fault state generally indicates that there has been a failure or short circuit of the first and second sensors or at the connection pins thereof.

At 390, the method 300 includes directing the appliance based on the determined fault state. For instance, one of more components of the appliance (e.g., some or all) may be deactivated such that an electrical current or voltage is prevented from passing thereto. In the case of a water heater appliance the heater elements within the tank may be deactivated such that heat is not actively generated therefrom. Additionally or alternatively, one or more components (e.g., some or all) of the appliance may be restricted such that a predetermined voltage limit is established for the operation of such components. Additionally or alternatively, a fault code or alert may be generated at a user interface or control panel. Such a fault code or alert may be a visual alert (e.g., presented at a display of the appliance) or an audio alert (e.g., projected from a speaker of the appliance), as would be understood.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method of operating an appliance comprising a first sensor and a second sensor, the method comprising:
   detecting a preliminary first conversion value at a first sensor input pin electrically connected to an analog-to-digital converter (ADC);
   detecting a preliminary second conversion value at a second sensor input pin electrically connected to the ADC in electrical parallel with the first sensor input pin;
   determining a preliminary variation between the preliminary first and second conversion values is less than or equal to a predetermined preliminary threshold;
   activating a pull-up resistor in electrical communication with the first sensor input pin;
   detecting a secondary first conversion value at the first sensor input pin during activation of the pull-up resistor;
   detecting a secondary second conversion value at the second sensor input during activation of the pull-up resistor;
   determining a secondary variation between the secondary first and second conversion values is less than or equal to a predetermined secondary threshold;
   identifying a fault state in response to determining the secondary variation; and
   directing the appliance based on the identified fault state, wherein detecting the preliminary first conversion value occurs simultaneously to detecting the preliminary second conversion value.

2. The method of claim 1, wherein the first sensor and the second sensor are temperature sensors.

3. The method of claim 2, wherein the first sensor and the second sensor are mounted to a water tank.

4. The method of claim 1, wherein activating the pull-up resistor is initiated in response to detecting a predetermined number of determinations that a unique preliminary variation between corresponding preliminary first and second conversion values is less than or equal to the predetermined preliminary threshold.

5. The method of claim 4, wherein the predetermined number of determinations is greater than or equal to 100 consecutive preliminary variation determinations.

6. The method of claim 1, wherein the predetermined preliminary threshold is less than 1%.

7. The method of claim 6, wherein the predetermined preliminary threshold is less than 0.5%.

8. The method of claim 7, wherein the predetermined preliminary threshold is less than 0.25%.

9. A method of operating an appliance comprising a first sensor and a second sensor, the method comprising:
   detecting a preliminary first conversion value from a first sensor input pin electrically connected to an analog-to-digital converter (ADC);
   detecting a preliminary second conversion value from a second sensor input pin electrically connected to the ADC in electrical parallel with the first sensor input pin;
   determining a preliminary variation between the preliminary first and second conversion values is less than or equal to a predetermined preliminary threshold;
   activating a pull-up resistor in electrical communication with the first sensor input pin;
   identifying a fault state in response based on a conversion value variation following activating the pull-up resistor; and
   directing the appliance based on the identified fault state, directing comprising deactivating or restricting one or more components of the appliance,
   wherein detecting the preliminary first conversion value occurs simultaneously to detecting the preliminary second conversion value.

10. The method of claim 9, wherein the first sensor and the second sensor are temperature sensors.

11. The method of claim 10, wherein the first sensor and the second sensor are mounted to a water tank.

12. The method of claim 9, wherein activating the pull-up resistor is initiated in response to detecting a predetermined number of determinations that a unique preliminary variation between corresponding preliminary first and second conversion values is less than or equal to the predetermined preliminary threshold.

13. The method of claim 12, wherein the predetermined number of determinations is greater than or equal to 100 consecutive preliminary variation determinations.

14. The method of claim 9, wherein the predetermined preliminary threshold is less than 1%.

15. The method of claim 14, wherein the predetermined preliminary threshold is less than 0.5%.

16. The method of claim 15, wherein the predetermined preliminary threshold is less than 0.25%.

17. A method of operating an appliance comprising a first sensor and a second sensor, the method comprising:
    detecting a preliminary first conversion value from a first sensor input pin electrically connected to an analog-to-digital converter (ADC);
    detecting a preliminary second conversion value from a second sensor input pin electrically connected to the ADC in electrical parallel with the first sensor input pin;
    determining a preliminary variation between the preliminary first and second conversion values is less than or equal to a predetermined preliminary threshold;
    activating a pull-up resistor in selective electrical communication with the first sensor input pin in electrical parallel with the second sensor input pin;
    identifying a fault state in response based on a conversion value variation following activating the pull-up resistor; and
    directing the appliance based on the identified fault state, directing comprising deactivating one or more components of the appliance,
    wherein detecting the preliminary first conversion value occurs simultaneously to detecting the preliminary second conversion value, and
    wherein the predetermined preliminary threshold is less than 1%.

18. The method of claim 17, wherein activating the pull-up resistor is initiated in response to detecting a predetermined number of determinations that a unique preliminary variation between corresponding preliminary first and second conversion values is less than or equal to the predetermined preliminary threshold.

19. The method of claim 18, wherein the predetermined number of determinations is greater than or equal to 100 consecutive preliminary variation determinations.

* * * * *